(12) United States Patent
Hsiao et al.

(10) Patent No.: US 7,559,769 B2
(45) Date of Patent: Jul. 14, 2009

(54) IC SOCKET

(75) Inventors: Shih-Wei Hsiao, Tu-Cheng (TW); Sung-Pei Hou, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/002,740

(22) Filed: Dec. 18, 2007

(65) Prior Publication Data

US 2008/0146083 A1    Jun. 19, 2008

(30) Foreign Application Priority Data

Dec. 18, 2006  (CN) .................... 2006 2 0171098 U

(51) Int. Cl.
*H01R 12/00* (2006.01)
(52) U.S. Cl. ........................ 439/66; 439/700
(58) Field of Classification Search .................. 439/66, 439/700, 482, 824
See application file for complete search history.

(56) References Cited

U.S. PATENT DOCUMENTS 6,159,056 A * 12/2000 Boyle .................... 439/700
6,814,626 B2 * 11/2004 Wen-Yao ................ 439/700
6,957,987 B2   10/2005 Ma et al.
7,285,026 B1 * 10/2007 Ju .......................... 439/700
7,300,288 B1 * 11/2007 Chen ....................... 439/66
7,367,813 B2 *  5/2008 Matsuo ..................... 439/66
7,396,261 B2 *  7/2008 Kroneder et al. ......... 439/700

FOREIGN PATENT DOCUMENTS

CN       2674686 Y      1/2005
CN    200956487 Y  *   9/2006

* cited by examiner

*Primary Examiner*—Hien Vu
(74) *Attorney, Agent, or Firm*—Wie Te Chung

(57) ABSTRACT

A socket for electrically connecting an integrated circuit (IC) to a print circuit board (PCB) comprises an insulating housing and a plurality of contacts received therein, each contact comprises a first contact connecting to the IC, a second contact electrically contacting with the PCB and a flexible member connecting the first contact and the second contact. The contact has a simple configuration, it could reduce the electrical inductance effectively, it also could be closely arranged to accord with the requirement of high-frequency circuitry and could perform rapid transmission of signal between the IC and the PCB.

10 Claims, 4 Drawing Sheets

IC SOCKET

BACKGROUND OF THE INVENTION

1. Field of the Invention

The present invention relates to a socket, especially to a socket for electrically connecting an integrated circuit to a print circuit board.

2. Description of the Related Art

A Land Grid Array (LGA) electrical connector for connecting an integrated circuit (IC) to a print circuit board (PCB) described in Chinese patent issue No. CN 2,674,686 mainly comprises an insulative housing defining a plurality of passageways and a plurality of terminals received in the passageways correspondingly. The terminal is formed by stamping from a conductive strip and includes a fastening portion positioned in the passageway, a contacting end extending upwardly from the fastening portion to electrically connect with the IC and a solder portion extending downwardly from the fastening portion to electrically connect with the PCB. Mount the electrical connector on the PCB to achieve the electrical contact between the terminals and the PCB, then put the IC on the electrical connector to achieve the electrical contact of IC and terminals, thereby the IC is electrically connected to the PCB.

Although the terminal of the connector said above has high conductivity, the connector has some disadvantages: first, the terminal would incline to one side to result in movement easily, second, the terminal would take up large space and could not be closely arranged for its complex configuration, otherwise, high electrical inductance would occur between adjacent terminals to affect the transmission of the high-frequency signals.

Hence, it is desirable to provide an improved electrical connector to overcome the aforementioned disadvantages.

SUMMARY OF THE INVENTION

An object of the invention is to provide a socket which comprises terminals with simple configuration and can perform rapid transmission of signal between an integrated circuit and a print circuit board.

To achieve the above-mentioned objects, a socket comprises an insulating housing defining a plurality of passageways therethrough and a plurality of contacts received in the passageways of the insulating housing, each contact have a first contact, a second contact defining a pair of guiding portions and a flexible member connecting the first contact and the second contact, each guiding portion defines a guiding slot, the first contact has a pair of projecting portions moveable in the guiding slots correspondingly.

Other features and advantages of the present invention will become more apparent to those skilled in the art upon examination of the following drawings and detailed description of preferred embodiments.

DETAILED DESCRIPTION OF PREFERRED EMBODIMENT

Reference will now be made in detail to the preferred embodiment of the present invention.

Figure 1:
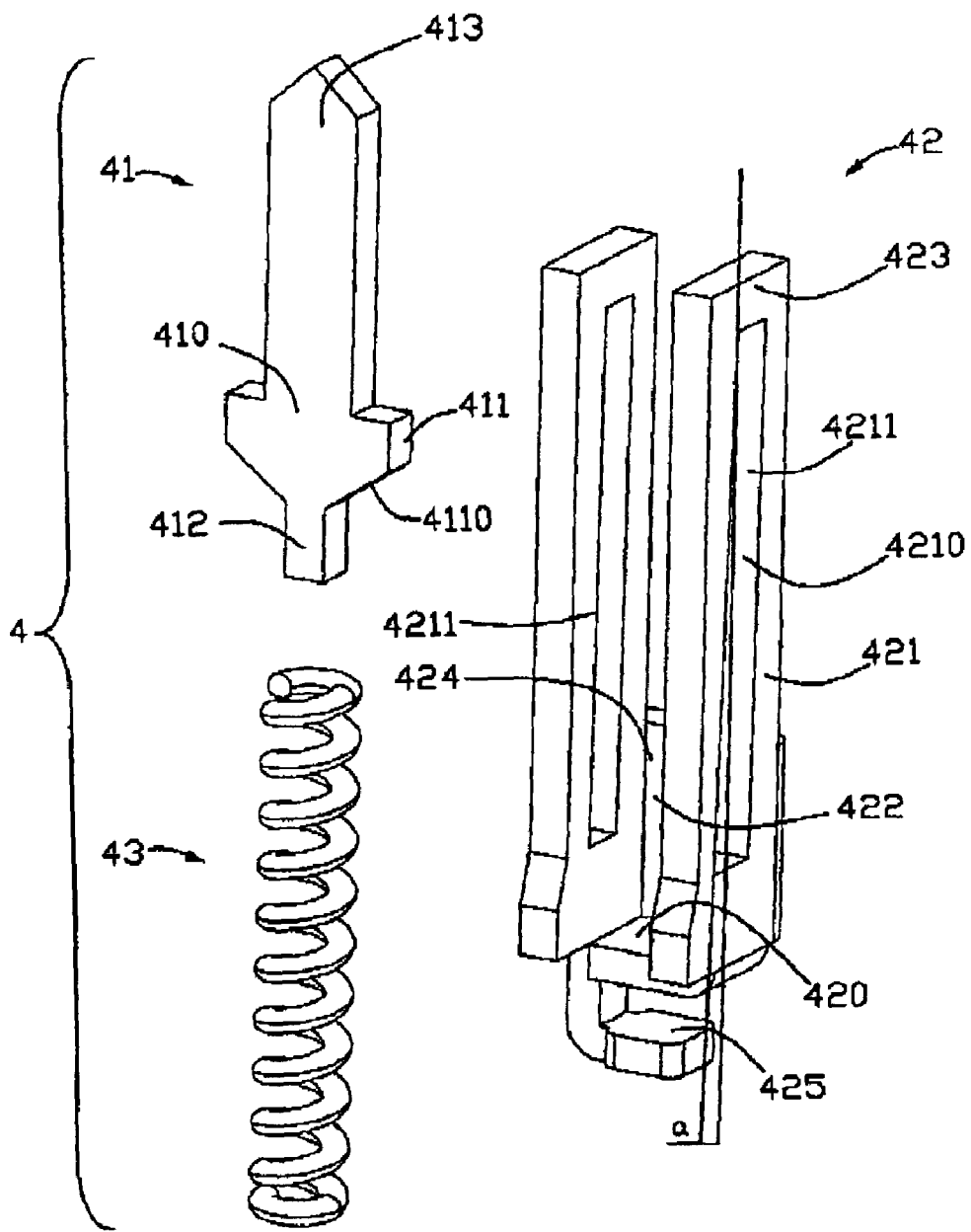
FIG. 1 is an exploded, perspective view of a contact of the present invention.
Figure 2:
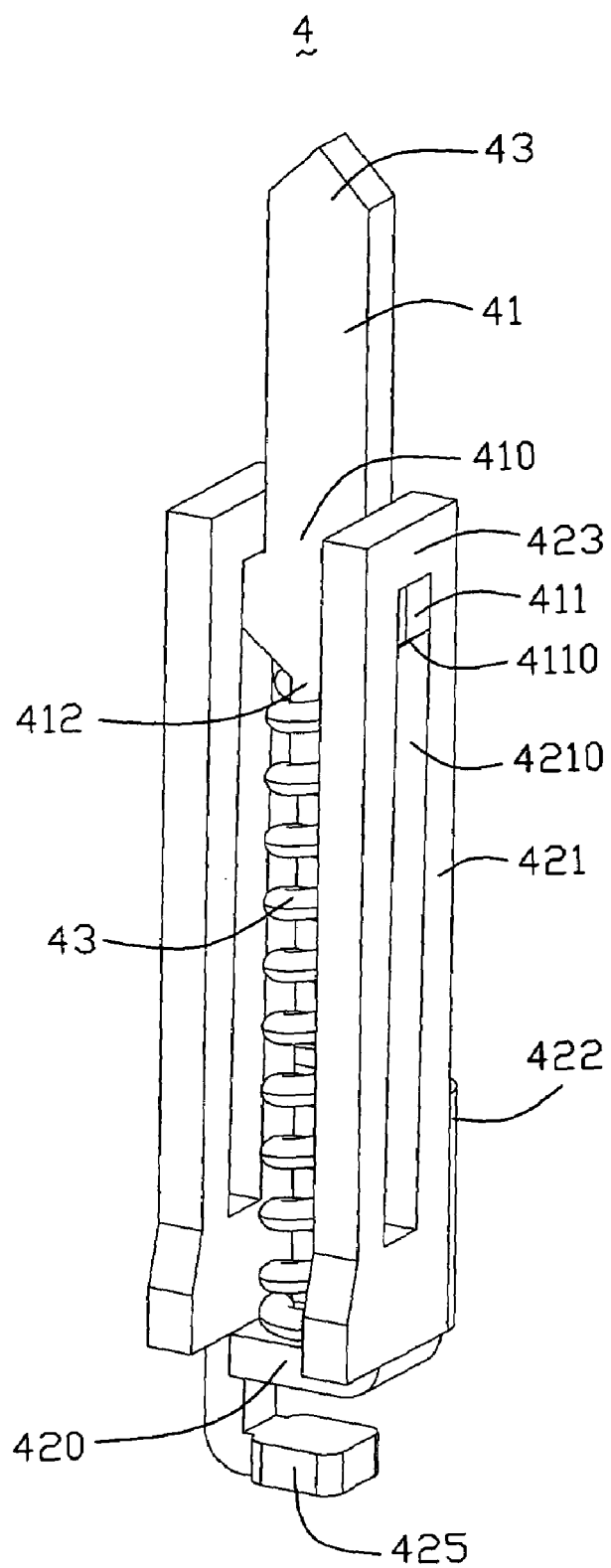
FIG. 2 is an assembled, perspective view of the contact of FIG. 1.
Figure 3:
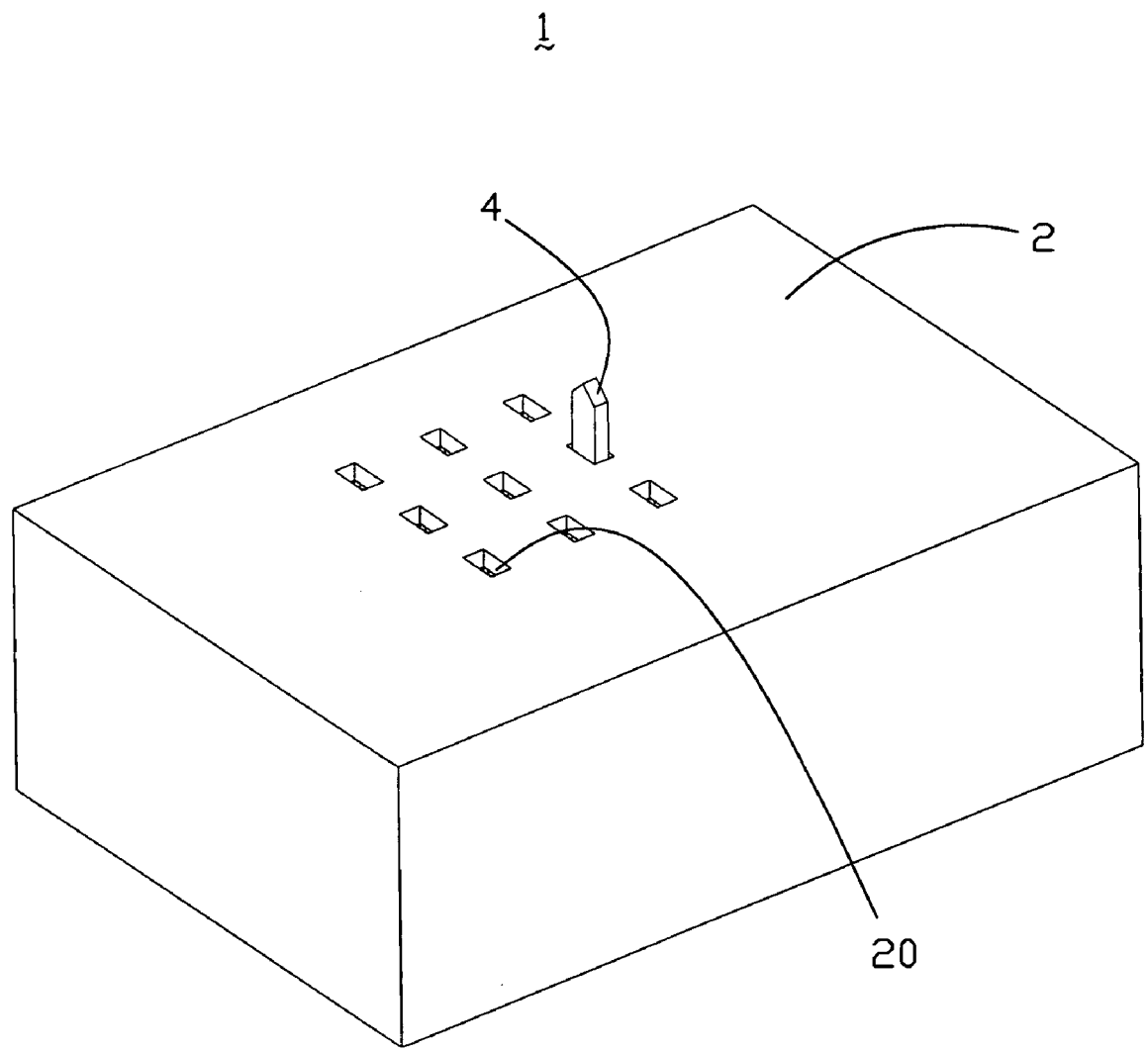
FIG. 3 is an assembled, perspective view of the socket, wherein the contacts are not shown entirely.
Figure 4:
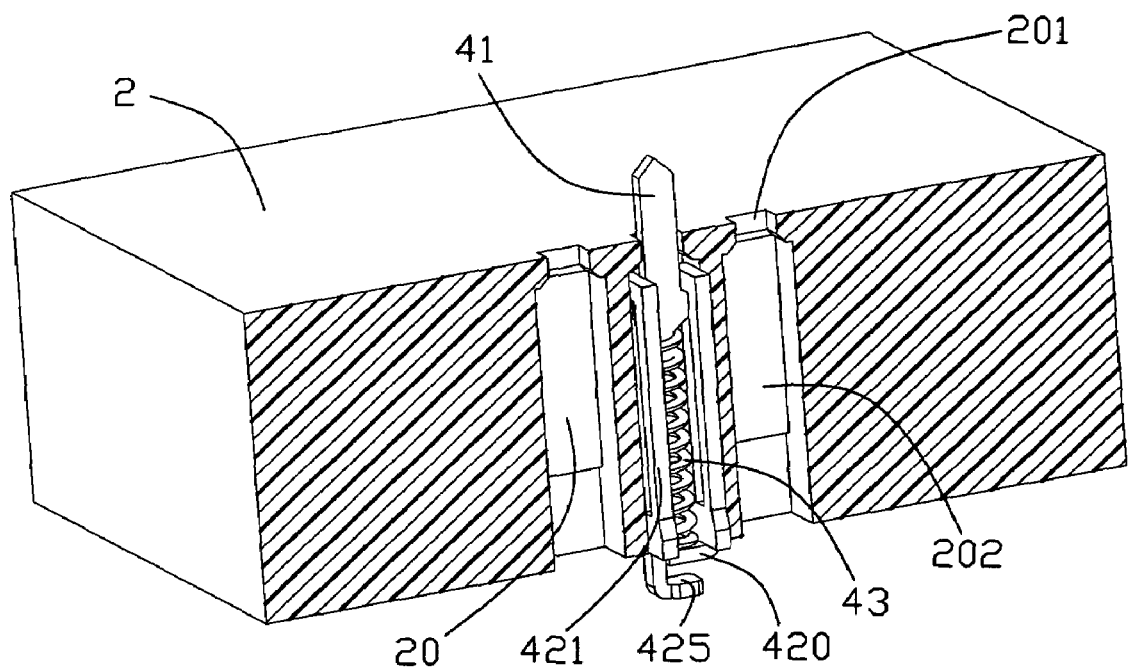
FIG. 4 is a partially cross sectional view of the socket of FIG. 3.

Referring to FIGS. 1 to 4, a socket 1 used for an integrated circuit (IC) (not shown) electrically connecting to a print circuit board (PCB) (not shown) are disclosed, it comprises an insulating housing 2 and a plurality contacts 4 received therein.

The insulating housing 2 is approximately in a tabulate shape, it has a top surface holding the IC and a bottom surface assembled to the PCB. The insulating housing 2 defines a plurality of passageways 20 through the top and bottom surface to receive the corresponding contacts 4 therein. Each passageway 20 is in quadrate hole shape and is divided into two sections, it includes a first passageway 201 of the upside and a second passageway 202 of the underside.

The contact 4 includes a first contact 41 received in the first passageway 201, a second contact 42 received in the second passageway 202 and a flexible member 43 connecting the first contact 41 and the second contact 42. The first contact 41, the second contact 42 and the flexible member 43 are all mental material, they are also could be other materials.

The first contact 41 is approximately in sword shape, it has a main portion 410, a pair of projecting portion 411 extending outwards from two opposite sides of the main portion 410, an inserting portion 412 extending from the main portion 410 downwardly and a triangular contacting portion 413 extending upwardly from the main portion 410 electrically contacting the IC, wherein the main portion 410 is wider than the inserting portion 412, the projecting portion 411 defines an inclined plane 4110 at the bottom to make the first contact 41 insert into the second contact 42 easily.

The second contact 42 comprises a pair of guiding pardons 421 defining face to face uprightly, a solder portion 425 extending downwardly from the bottom of one of the guiding portions 421, a base portion 420 extending from the bottom of another of the guiding portions 421 to connect the bottom of the opposite guiding portion 421 and a connecting portion 422 connecting the two guiding portions 421. The guiding portions 421 are in long board shapes, they have a pair of front sides from which extend a pair of tubers (not labeled) retaining the second contact 42 in the second passageway 202 and a pair of back sides which are connected by the connecting portion 422, each guiding portion 421 defines an obturating guiding slots 4210 which doesn't extend through the guiding portion upwardly, and the projecting portions 411 are moveable in the guiding slots 4210 correspondingly. The guiding portion 421 defines a positional portion 423 near the top of the guiding slot 4210 to control the movement of the projecting portion 411. Each guiding portion has a pair of parallel longitudinal sides 4211, and each of the two longitudinal sides 4211 has an angle α relative to a central axis of the guiding portion.

The flexible member 43 is a spring, it connects to the first contact 41 by the interference with the inserting portion 412 of the first contact 41.

When assembly, to flexible member 43 is received in the receiving groove 424 of the second contact 42, the first contact 41 is inserted into the second contact 42 along the inclined plane 4110, the projecting portions 411 of the first contact 41 are moveable in the guiding slots 4210 of the second contact 42 and the inserting portion 412 is disposed in the flexible member 43 at this moment. The first contact 41 would closely contact with one of the declining longitudinal sides 4211 of the guiding slot 4210 while the projecting portions 411 moving in the guiding slots 4210. Each contact 4 is inserted into the insulating housing 2 from bottom to top, the first contact 41 and the second contact 42 are received in the first passageway 201 and the second passageway 202 correspondingly. The solder portion 425 of the second contact 42 is soldered to the PCB to perform the electrical connection between the socket and the PCB. The IC is disposed on the top of the first contacts 41 and the first contacts 41 would move downwardly under the press. The projecting portions 411 mating with the guiding portions 421 to perform the electrical connection between the first contact 41 and the second contact 42, thereby it achieves the electrical connection between the IC and the PCB. The flexible member 43 would return to the original state and the first contact 41 would return to the original position while there are no force outside, thereby it forms a compressible socket. The socket 1 of the invention has a simple structure, it could reduce the electrical inductance effectively and the contacts 4 could be closely arranged to accord with the requirement of high-frequency circuitry it can perform rapid transmission of signals between the IC and the PCB thereby.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket comprising:
   an insulating housing defining a plurality of passageways therethrough;
   a plurality of contacts received in the passageways of the insulating housing, each contact having a first contact, a second contact defining a pair of guiding portions and a flexible member connecting the first contact and the second contact, each guiding portion defining an obturating guiding slot, the first contact having a pair of projecting portions moveable in the guiding slots correspondingly;
   wherein each first contact comprises a main portion, a triangular contacting portion extending upwardly from the main portion and an inserting portion being, received in the flexible member, the projecting portions extend outwards from two opposite sides of the main portion;
   wherein the second contact comprises a base portion connecting bottom ends of the guide portions, a connecting portion connecting sides of the guiding portions and a solder portion extending downwardly from one of the guiding portions;
   wherein the base portion extends from the bottom of another guiding portion to connect the bottom of the opposite guiding portion and space from the solder portion, the base portion is parallel with the solder portion;
   wherein the guiding portions, the connecting portion and the base portion form a receiving groove accepting the flexible member together.

2. The socket of claim 1, wherein each guiding slot has a pair of longitudinal sides and each of the two longitudinal sides is declined relative to an central axis of the guiding portion.

3. The socket of claim 1, wherein the guiding portion defines a positional portion new the top of the guiding slot to control the movement of the projecting portion.

4. The socket of claim 1 wherein each passageway comprises a first passageway receiving the first contact and a second passageway receiving the second contact.

5. The socket of claim 1, wherein each projecting portion defines an inclined plane on a bottom face thereof for convenient insertion of the projecting portion into the guiding slot.

6. The socket of claim 1, wherein the flexible member is a spring.

7. The socket of claim 1, wherein the guiding portions are in long board shapes and are defined face to face uprightly, the guiding portions have a pair of front sides from which extend a pair of tubers retained in the passageway and a pair of back sides which are connected by the connecting portion.

8. An electrical connector comprising:
   an insulative housing defining a plurality of passageways;
   a contact disposed in each of said passageways, said contact including a moveable part and an immoveable part assembled together, said moveable part having a projection guidably transversely received in an obturating guiding slot of the immoveable part, said immovable part having a pair of guiding portions each having said guiding slot defining opposite upper and lower closed type ends thereof, engagement between the projection and the guiding slot restricting movement of the moveable part with regard to the immoveable part in a first direction while allowing moving back and forth in a second direction perpendicular to the first direction; and
   a biasing device constantly urging the moveable part away from the immoveable part along said second direction;
   wherein each movable part comprises a main portion, a triangular contacting portion extending upwardly from the main portion and an inserting portion being, received in the biasing device, the projecting portions extend outwards from two opposite sides of the main portion;
   wherein said immoveable part comprises a base portion connecting bottom ends of the guide portions, a connecting portion connecting sides of the guiding portions and a solder portion extending downwardly from one of the guiding portions;
   wherein the base portion extends from the bottom of another guiding portion to connect the bottom of the opposite guiding portion and space from the solder portion, the base portion is parallel with the solder portion.

9. The electrical connector as claimed in claim 8, wherein the guiding slot is formed in the immoveable part and the projection is formed on the moveable part.

10. The electrical connector as claimed in claim 8, wherein the upper closed type end of the guiding slot restrict movement of the moveable part relative to the immoveable part along said second direction due to forces generated by the biasing device.

* * * * *